(12) United States Patent
Conemac

(10) Patent No.: US 6,621,609 B1
(45) Date of Patent: *Sep. 16, 2003

(54) LIGHT BEAM DISPLAY

(75) Inventor: Donald C. Conemac, Simi Valley, CA (US)

(73) Assignee: Advanced Laser Technologies, Inc., Simi Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/806,163
(22) PCT Filed: Oct. 8, 1999
(86) PCT No.: PCT/US99/23414
§ 371 (c)(1),
(2), (4) Date: Mar. 27, 2001
(87) PCT Pub. No.: WO00/20912
PCT Pub. Date: Apr. 13, 2000

Related U.S. Application Data

(63) Continuation of application No. 09/169,163, filed on Oct. 8, 1998, now Pat. No. 6,175,440, which is a continuation-in-part of application No. 08/887,947, filed on Jul. 3, 1997, now Pat. No. 6,008,925, which is a continuation of application No. 08/162,043, filed on Feb. 2, 1994, now Pat. No. 5,646,766.

(51) Int. Cl.[7] .......................... G02B 26/08; G02F 1/00; H04N 5/74; H04N 9/31

(52) U.S. Cl. ....................... 359/204; 359/212; 359/216; 348/750; 348/752; 348/760; 347/232; 347/233

(58) Field of Search ................................. 359/204, 212, 359/216; 348/750, 752, 760, 756, 757, 758; 347/232, 233, 231

(56) References Cited

U.S. PATENT DOCUMENTS

| 4,101,193 A | 7/1978 | Waterworth et al. |
| 4,257,669 A | 3/1981 | Scorteanu |
| 4,978,185 A | 12/1990 | Appel |

(List continued on next page.)

FOREIGN PATENT DOCUMENTS

| CA | 1081009 | 8/1980 |
| DE | 19703606.6 | 8/1997 |
| JP | 51103447 | 9/1976 |
| JP | 51-103447 | 9/1976 |
| JP | 52102750 | 8/1977 |
| JP | 52-102750 | 8/1977 |
| JP | 58-105117 | 6/1983 |
| JP | 60-238808 | 11/1985 |
| JP | 60238808 | 11/1985 |
| JP | 62-90614 | 4/1987 |
| JP | 6290614 | 4/1987 |
| JP | 02203316 | 8/1990 |
| WO | WO 94/18802 | 8/1994 |

Primary Examiner—Audrey Chang
(74) Attorney, Agent, or Firm—Myers Dawes Andras & Sherman

(57) ABSTRACT

A laser beam display includes at least a first and second plurality of laser beam sources, each of which may preferably be an array of semiconductor lasers, providing a plurality of laser beams in an optical path so as to reflect off of reflective facets of a movable reflector and illuminate a display screen. In a color display, each column of the laser array corresponds to a separate primary color. The separate rows of each array correspond to independently activated but simultaneously driven scan lines to be illuminated by the laser beam scanning apparatus. The plural laser beam arrays subdivide the width of the screen into smaller scan segments to increase the scanning angle or increase the horizontal scanning speed of the apparatus. Tilted facets illuminate different vertical sections of the screen with the laser beams as the reflector rotates. A scan format employing simultaneously illuminated diagonal scan tiles provides optimal use of the plural laser beam arrays.

20 Claims, 7 Drawing Sheets

U.S. PATENT DOCUMENTS

| | | |
|---|---|---|
| 5,148,285 A | 9/1992 | Nakane et al. |
| 5,515,198 A | 5/1996 | Kusuda et al. |
| 5,694,235 A | 12/1997 | Kajiki |
| 5,715,021 A * | 2/1998 | Gibeau et al. .............. 348/750 |
| 5,719,832 A | 2/1998 | Kataoka et al. |
| 5,946,125 A | 8/1999 | Ang |
| 6,011,643 A | 1/2000 | Wunderlich et al. |
| 6,020,937 A | 2/2000 | Bardmesser |
| 6,057,964 A | 5/2000 | Roeder et al. |
| 6,091,461 A | 7/2000 | Bardmesser |
| 6,137,461 A | 10/2000 | Deter et al. |
| 6,140,979 A | 10/2000 | Gerhard et al. |
| 6,175,440 B1 * | 1/2001 | Conemac .................... 359/204 |

* cited by examiner

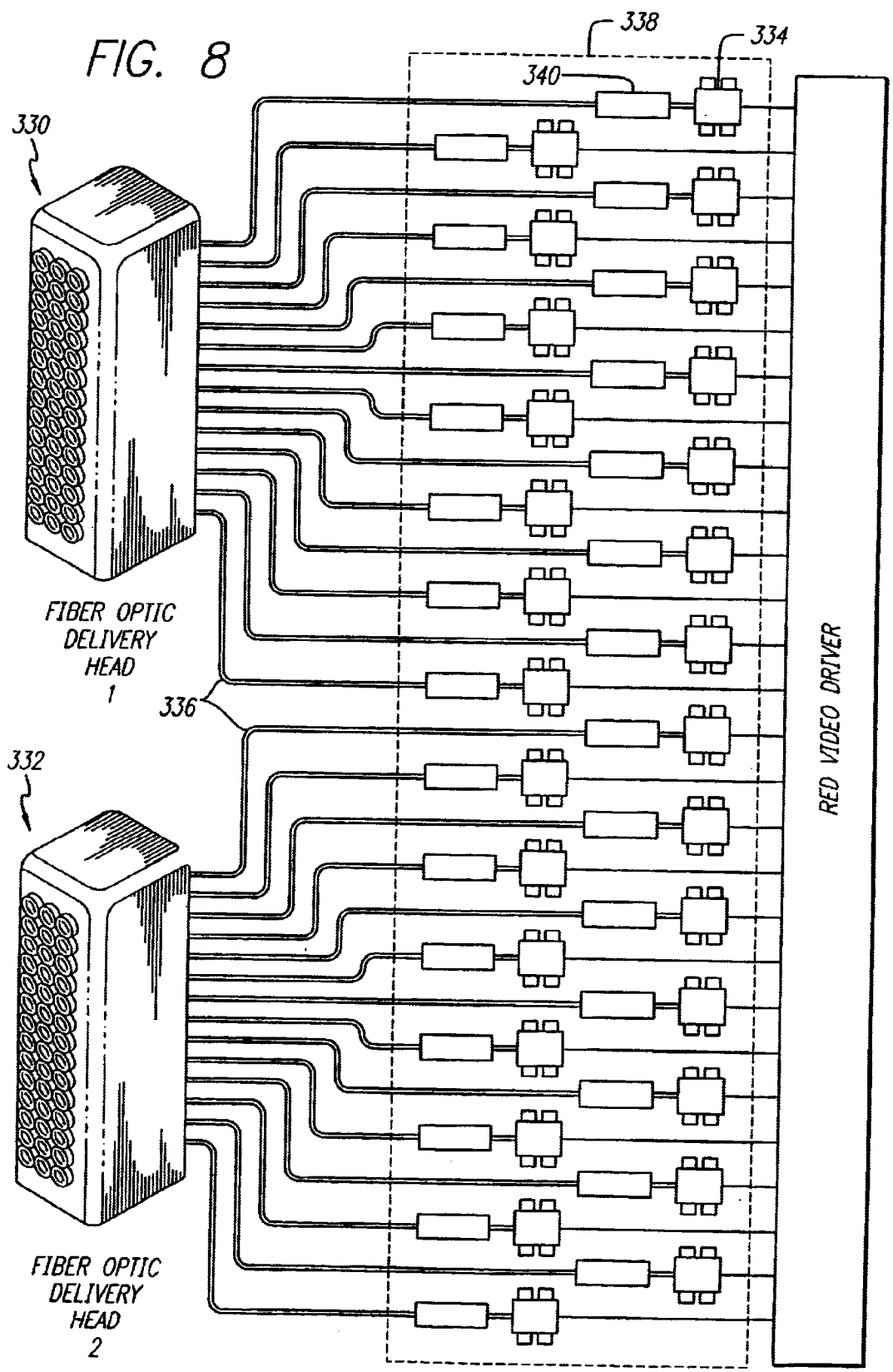

LIGHT BEAM DISPLAY

RELATED APPLICATION INFORMATION

This application is a continuation of U.S. Ser. No. 09/169,163 filed Oct. 8, 1998, now U.S. Pat. No. 6,175,440 which in turn is a continuation-in-part of U.S. Ser. No. 08/887,947 filed on Jul. 3, 1997, now U.S. Pat. No. 6,008,925 which in turn is a continuation of U.S. Ser. No. 08/162,043 filed on Feb. 2, 1994, now U.S. Pat. No. 5,646,766. The disclosure of the above noted patent and applications are incorporated herein by reference.

BACKGROUND OF THE INVENTION

1. Field of the Invention

The present invention relates to methods and apparatus for displaying an image by employing a light beam or beams.

2. Description of the Prior and Related Information

High resolution displays have a variety of applications, including computer monitors, HDTV and simulators. In such applications, the primary considerations are resolution, maximum viewable area, cost and reliability. Although a number of approaches have been employed including CRT displays, rear projection and front projection displays, plasma displays and LCDs, none of these have been able to satisfactorily provide all the above desirable characteristics. In other display applications, such as control panel displays, and vehicle and aircraft on-board displays, resolution is of less importance than brightness, compact size and reliability.

Although lasers potentially can provide many advantages for displays of both types noted above, laser based displays have not been widely employed. This is due in large part to limitations in the laser scanning engines available. One conventional approach to scanning a laser beam employs a rotating mirror to scan the laser beam in a linear direction as the mirror rotates. Typically, the mirror is configured in a polygon shape with each side corresponding to one scan length of the laser beam in the linear direction.

An example of such a rotating polygon laser beam scanner is illustrated in FIG. 1. The prior art laser beam scanning apparatus shown in FIG. 1 employs a polygon shaped mirror 1 which receives a laser beam provided by laser 2 and deflects the laser beam in a scanning direction X as the polygon 1 rotates. It will be readily appreciated from inspection of the geometry of FIG. 1 that such a rotating polygon system has the ability to scan the laser beam through a maximum angle of 180° with a scan line duration determined by the rotational speed of the polygon divided by N, where N is the number of polygon sides. Also, it will be appreciated that for large N the scan angle may be significantly reduced below 180°. Thus, for the eight sided polygon configured as illustrated in FIG. 1, the laser beam is scanned through an angle of about 90° with the duration of each scan line being ⅛ the period for one rotation of the polygon.

The laser scanning apparatus illustrated in FIG. 1 has the advantage of being quite simple, and is suitable for some applications. Nonetheless, this conventional laser scanning apparatus is not suitable for high resolution displays since the inherent limitations of such apparatus make it difficult to simultaneously achieve a high degree of resolution, high scanning speed and a large scanning angle. More specifically, a high degree of resolution requires a relatively large polygon with few sides. That is, if the laser beam is to provide accurate information as it is scanned along the scan direction, modulation of the laser beam as it traverses the surface of the polygon side must unambiguously provide discrete points in the scan direction. Thus, each side of the polygon must increase with the beam diameter and the number of discrete scan points (n). Therefore, high resolution, corresponding to a very large number (n) of discrete scan points, in general requires large polygon sides. This limitation is particularly significant where the scanned beam target surface is located close to the polygon mirror. Also, as noted above, the scan angle is reduced as the number of polygon sides is increased. Therefore, high resolution and high scan angle require a large polygon with relatively few sides.

The requirements of a large polygon with few sides, however, mitigate against a high scan rate and thus severely restricts resolution and/or refresh rate of a display based on such a laser beam scanning apparatus. As indicated above, scanning speed is directly related to the number of polygon sides. Therefore, a polygon with few sides requires very high speed rotation to achieve high scanning speed. Rotating a large polygon at high speed creates mechanical problems, however. In particular, high speed rotation introduces vibrations, stress on the moving parts, and reduced accuracy in the registration of the mirror relative to the laser beam. These factors collectively limit the rotational speed of the mirror, and hence the beam scan rate.

As noted above, another category of display application of increasing importance requires relatively small but robust displays having good brightness and acceptable resolution for graphics, such as maps, and text. Such displays have significant applications in automobiles and other vehicles. In such applications, a laser based display has potential advantages due to its brightness. However, once again, the existing laser beam scanning apparatus are not well suited. In particular, the optical path of the laser beam is quite short in such applications due to the compact space available for the display. This requires the size of the rotating polygon to be increased. However, mechanical instability is associated with large rotating polygons and is a serious detriment for such applications, where reliability is critical.

Accordingly, it will be appreciated that a need thus presently exists for an improved laser beam display apparatus.

SUMMARY OF THE INVENTION

The present invention provides a display apparatus and method employing scanning of light beams through a large scan angle at high speed and with a high degree of accuracy to provide a high resolution display. The present invention further provides a light beam display apparatus having a relatively compact configuration for a given screen size and which is relatively free of vibration or other mechanical problems even at high resolutions and refresh rates.

The present invention provides a laser beam display which includes a first and second plurality of light beam sources, each of which may preferably be an array of semiconductor lasers, providing a plurality of light beams in an optical path so as to simultaneously reflect off plural reflective facets of a movable reflector and illuminate a display screen. In a color display, each column of the laser array corresponds to a separate primary color and the separate rows of the array correspond to independently activated but simultaneously driven scan lines to be illuminated by the laser beam scanning apparatus. The plural laser beam arrays subdivide the width of the screen into smaller scan segments to increase the scanning angle or increase the horizontal scanning speed of the apparatus. A scan format employing simultaneously illuminated diagonal scan tiles provide optimal use of the plural laser beam arrays.

More specifically, in a preferred embodiment the light beam scanning apparatus of the present invention includes an input for receiving video data including a plurality of horizontal lines of display information and a high speed memory for storing the video data for plural horizontal lines. First and second light diode arrays are provided, each comprising a plurality of rows and at least one column. A control circuit controls simultaneous activation of the light beams in accordance with the video data from plural horizontal lines stored in the high speed memory. An optical path including a movable reflector directs the simultaneously activated plural beams from both diode arrays off of at least two facets of the movable reflector to the display screen.

In a further aspect the present invention provides a method of displaying information on a display screen employing a plurality of light beam sources and a rotatable reflector having a plurality of reflective facets tilted at different angles. A first plurality of light beams are directed to a first facet of the movable reflector tilted at a first angle, and from the first facet to the display screen, from the first light beam source. A second plurality of light beams are directed to a second facet of the movable reflector tilted at a different angle, and from the second facet to the display screen, from the second light beam source. The reflector is rotated so as to cause the first and second plurality of light beams to simultaneously trace out parallel multiline scan segments on the display screen. The parallel scan segments are displaced vertically on the screen by the tilted facets so as to provide a generally diagonal configuration on the display screen. The entire screen is illuminated by tiling the screen with these diagonal scan patterns as different tilted facets rotate into the optical path of the light beams.

Further features and advantages of the present invention will be appreciated from the following detailed description of the invention.

BRIEF DESCRIPTION OF THE DRAWINGS

FIG. 8 illustrates two fiber optic delivery heads in accordance with the alternate embodiment of the present invention.

DETAILED DESCRIPTION OF THE INVENTION

Figure 1:
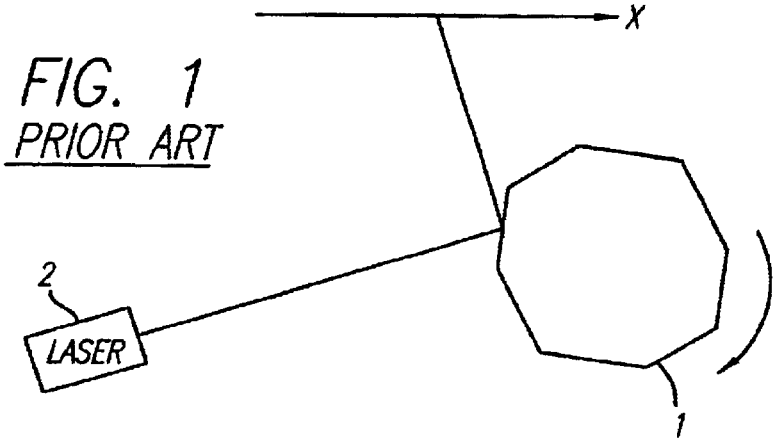
FIG. 1 is a top schematic view of a prior art laser scanning apparatus.
Figure 2:
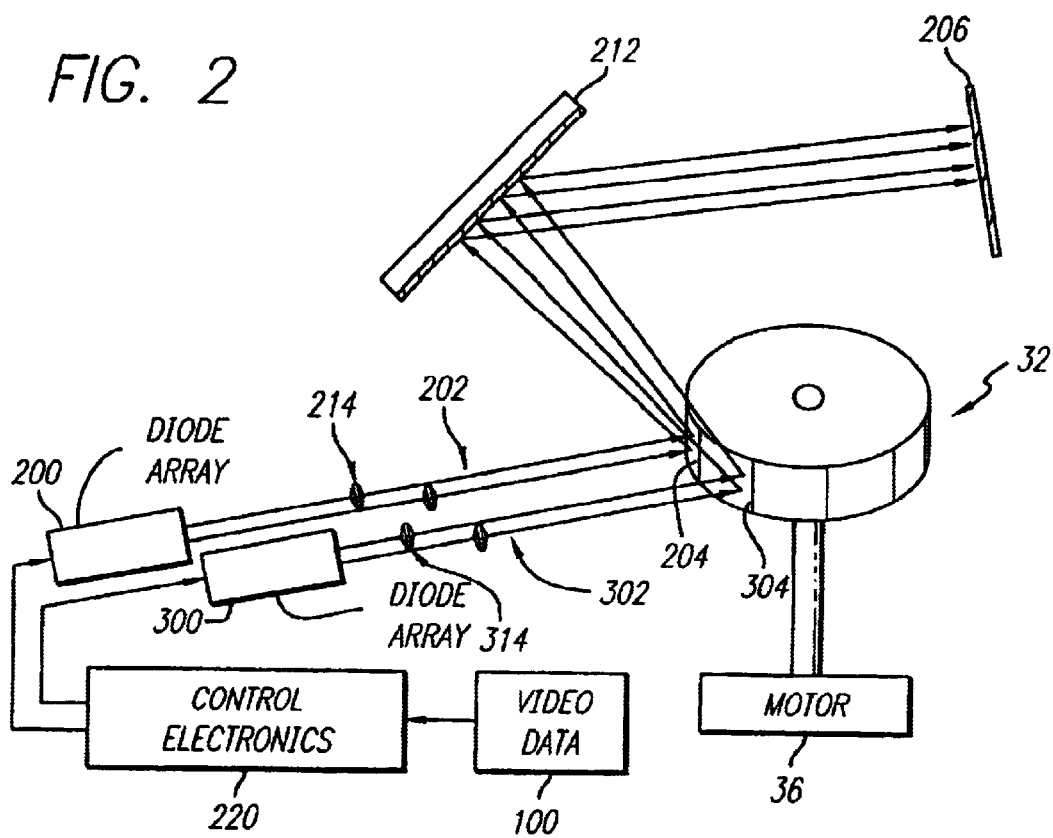
FIG. 2 is a schematic drawing of a laser beam display in accordance with a preferred embodiment of the present invention.

Referring to FIG. 2, a preferred embodiment of the laser beam display apparatus of the present invention is illustrated in a schematic drawing illustrating the basic structure and electronics of the embodiment. The dimensions of the structural components and optical path are not shown to scale in FIG. 2, and the specific dimensions and layout of the optical path will depend upon the specific application.

As shown in FIG. 2, the laser beam scanning apparatus includes a multifaceted polygon reflector 32. The polygon shaped reflector 32 is preferably coupled to a variable speed motor 36 which provides for high speed rotation of the reflector 32 such that successive flat reflective facets on the circumference thereof are brought into reflective contact with the laser beams. The rotational speed of the reflector 32 is monitored by an encoder (not shown) which in turn provides a signal to motor control circuit (which may be included in the control electronics 220). The motor control circuitry, power supply and angular velocity control feedback may be as described in U.S. Pat. No. 5,646,766 the disclosure of which is incorporated herein by reference. Although a wheel shaped multi-faceted reflector 32 is presently preferred, it will be appreciated that other forms of movable multi-sided reflectors may also be employed to consecutively bring reflective flat surfaces in reflective contact with the laser beams. Such alternate reflectors may be actuated by any number of a wide variety of electromechanical actuator systems, including linear and rotational motors, with a specific actuator system chosen to provide the desired speed of the facets for the specific application.

The apparatus of FIG. 2 further includes a first source 200 of a plurality of laser beams 202, which plural beams may include beams of different frequencies/colors as discussed in detail below, and an optical path for the laser beams between the laser source 200 and a display screen 206. A second source 300 of a plurality of beams 302 is also provided, with a generally parallel optical path to display screen 206. As one example of a presently preferred embodiment the laser sources 200, 300 may each comprise a rectangular array of laser diodes having a plurality of rows and at least one column. A monochrome display may have a single column for each diode array whereas a color display may have 3 columns. A color array thus provides the 3 primary colors for each row. The number of rows corresponds to the number of parallel scan lines traced out on the display screen 206 by each diode array. For example, 14 rows of diodes may be employed. Each two-dimensional diode array 200, 300 may thus provide from 1 to 42 separate laser beams 202, 302 simultaneously (under the control of control electronics 220, discussed below). Other sources of a plurality of laser beams may also be employed. For example, a single beam may be split into a plurality of independently modulated beams using an AOM modulator, to thereby constitute a source of a plurality of beams. Such an approach for creating plural beams using an AOM modulator is described in U.S. Pat. No. 5,646,766, incorporated hereby by reference.

The optical path is configured such that the laser beams intercept the rotating polygon 32 in a manner so as to provide a desired scan range across display screen 206 as the polygon rotates. The optical path will depend on the specific application and as illustrated may employ one or more reflective optical elements 212 to increase the path length. Also, one or more lenses 214, 314, may be provided for each laser beam 202, 302 so as to focus the beams with a desired spot size on display screen 206.

It will be appreciated that a variety of modifications to the optical path and optical elements illustrated in FIG. 2 are possible. For example, additional optical elements may be provided to increase the optical path length or to vary the geometry to maximize scan range in a limited space application. Alternatively, the optical path may not require any path extending elements such as reflective element 212 in an application allowing a suitable geometry of beam sources 200, 300, reflector 32 and screen 206. Similarly, additional focusing or collimating optical elements such as lenses 214 may be provided to provide the desired spot size for the specific application. In other applications the individual focusing elements 214, 314 may be combined for groups of diodes. For example, all the diodes in a single row of a diode array may be focused by a single optical focusing element 214, 314. In yet other applications, the focusing elements may be dispensed with if the desired spot size and resolution can be provided by the laser beams emitted from the diode arrays 200, 300 itself. The screen 206 in turn may be either a reflective or transmissive screen with a transmissive diffusing screen being presently preferred for compact displays or where a high degree of brightness is desired.

As further illustrated schematically in FIG. 2, the laser beam sources 200, 300 provide the plurality of laser beams, illustrated generally by beams 202, 302 in FIG. 2, simultaneously on respective facets 204, 304 of the rotating reflector 32. In particular, plural beams 202 are simultaneously directed to respective spots or pixels on display 206 via facet 204. Plural beams 302 via facet 304 are in turn simultaneously directed to a different set of pixels on display 206. A plurality of beams from a laser source 200 or 300 may also simultaneously illuminate a single pixel. In particular, in a color display all three diodes in a single row of the diode array may simultaneously illuminate a single pixel. Even in a monochrome display application plural beams may be combined at a single pixel to provide increased brightness. This combination of plural beams to plural pixels is illustrated generally in FIG. 2 by the four laser beams simultaneously being directed to display 206, each of which preferably includes plural distinct component beams of different frequency or color. The specific manner in which the beams 202, 302 trace out the video data on the screen 206 will be described in more detail below in relation to FIGS. 3 and 4A–4C.

Still referring to FIG. 2, the diode arrays 200, 300 are driven by control signals provided from control electronics 220 which in turn receives the video information to be displayed from video data source 100. Video data source 100 may comprise any source of video information to be displayed on display 206 and may comprise a source of analog or digital video signals in any of a variety of known formats. Control electronics 220 converts the video data provided from source 100 to digital form if necessary and then to a parallel scan format adapted for the specific scan pattern provided by the diode arrays 200, 300, as described in more detail below.

Figures 3, 5:
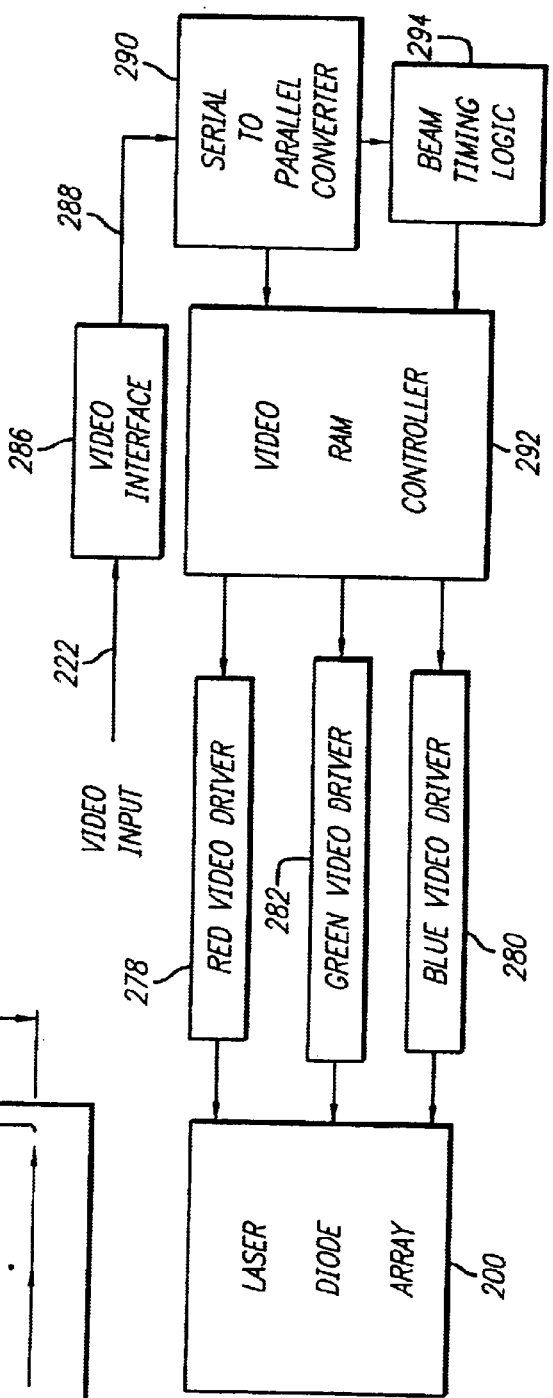
FIG. 3 is a schematic drawing of a scan pattern in accordance with the operation of the laser display of the present invention.
FIG. 5 is a block schematic drawing of the circuitry of a preferred embodiment of the laser beam display of the present invention.

Referring to FIG. 3, the manner in which the multiple diode arrays 200, 300 simultaneously provide plural beams to plural facets and provide an increased scanning speed and/or scanning angle for the display, is illustrated.

In FIG. 3, a front view of display screen 206 is schematically illustrated with the usable part of the screen having a width dimension (W) and a height dimension (H). The display shown is for a color display, with three beams of different color light simultaneously activated and focused on each pixel 210, 310, from each of the laser sources 200, 300, respectively. These individual beams preferably correspond to the three primary colors red, blue and green to provide a color image on display 206. Thus, for the two sets of pixels 210, 310 illustrated in FIG. 3, red, blue and green laser beams (RBG) are provided simultaneously by laser sources 200, 300.

As shown in FIG. 3, the width dimension (W) of display screen 206 may be subdivided into plural horizontal scan segments corresponding to the number of diode arrays. Although two horizontal scan segments 208, 308 are illustrated, corresponding to two diode arrays 200, 300, the number of such segments and diode arrays is not so limited and generally may be 2–10 or greater in number. In the first horizontal scan segment 208 a first plurality of beams is provided from diode array 200 to plural rows of pixels 210 as illustrated in FIG. 3 to trace out a first set of scan lines 212. At the same time a plurality of beams from diode array 300 illuminate plural rows of pixels 310 which trace out a second set of scan lines 312 in the second horizontal scan segment 308. These respective beams, scanned along plural horizontal scan linesby rotation of reflector 32, thus generate a first vertical scan segment 316. Accordingly, it will be appreciated that for rotation of the polygon 32 through an angular range corresponding to a single facet width, the width scanned out on the screen 208 will be double that provided by single source of laser beams. Accordingly, a concomitant increase in scanning speed and/or screen size is provided.

The vertical range or height (H) of the display screen 208 is scanned out by repeating the parallel scanning for each of the vertical scan segments 316. It will be appreciated that to consecutively scan the laser beams over the respective vertical scan segments 316, some means is required for shifting the beams vertically to cover the entire vertical distance H shown in FIG. 3. Several different such means for vertically shifting the beams are described in U.S. Pat. No. 5,646,766 the disclosure of which is incorporated herein by reference.

In a presently preferred embodiment the vertical shifting of the beams is achieved by using facets of the rotating polygon 32 which are angled at differing degrees relative to the axis of rotation of the polygon 32. Each differing facet angle thus corresponds to a different vertical position on the display screen 206 allowing the different vertical scan segments 316 to be traced out as the laser beams 202, 302 intercept consecutive ever more tilted facets. Therefore, one rotation of the polygon 32 will result in all the vertical scan segments 316 being illuminated providing an image on the entire usable surface area of display screen 206.

Figure 4A:
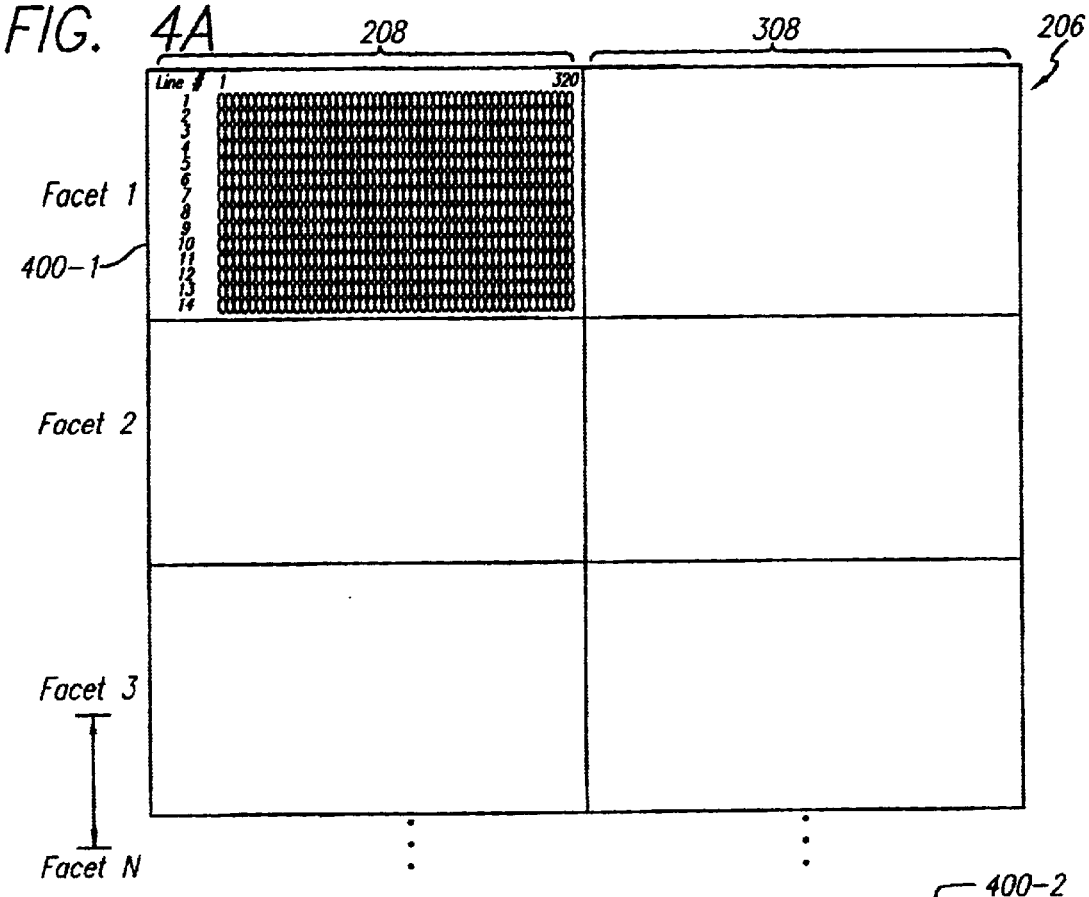
FIGS. 4A–4C are schematic drawings of a scan pattern provided in accordance with a preferred mode of operation of the laser beam display of the present invention.
Figure 4B:
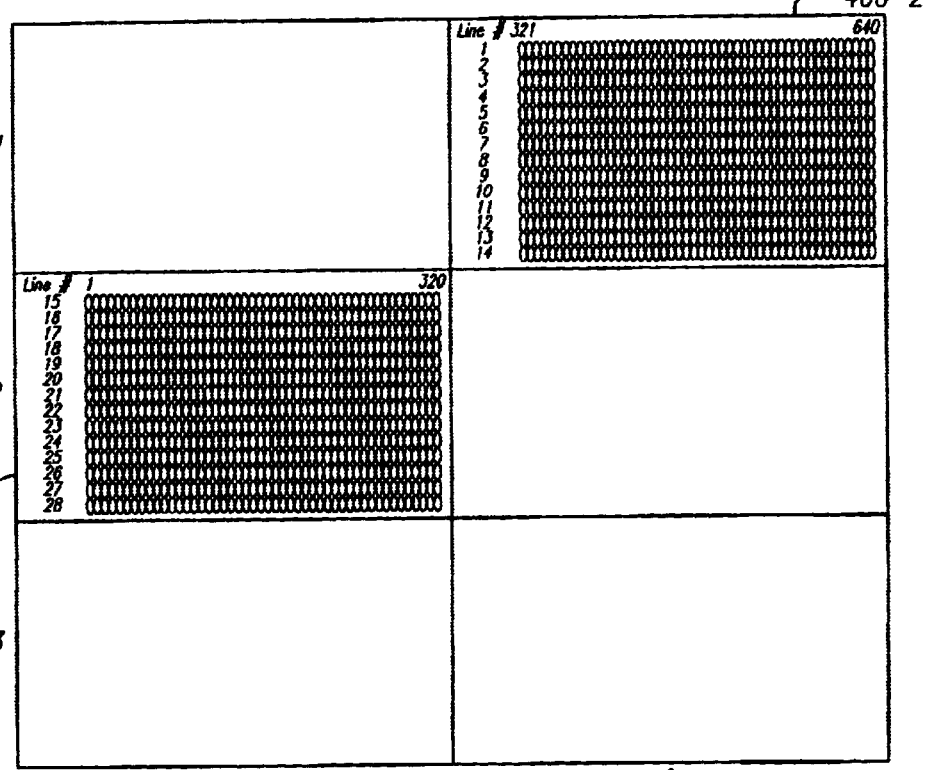
Figure 4C:
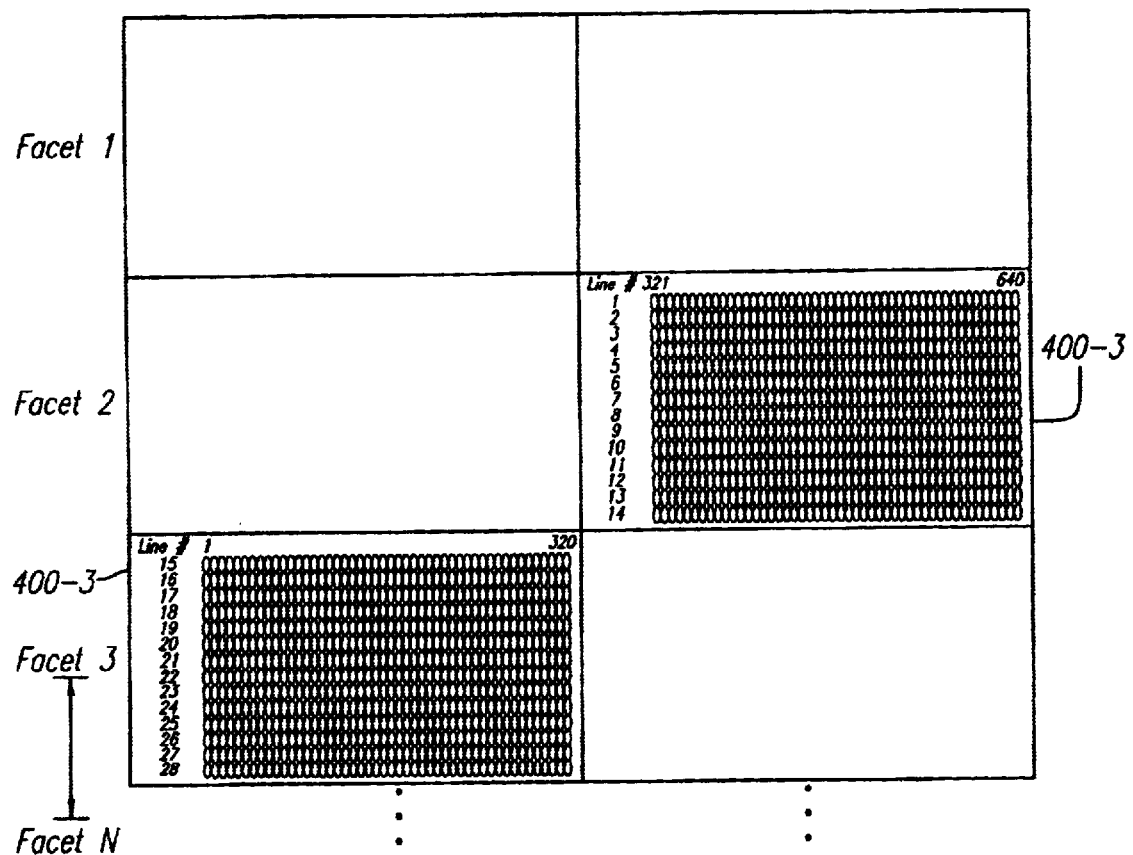

In accordance with the use of tilted facets of the rotating polygon reflector 32 as a means for vertically shifting the laser beams, a modification of the scanning format of FIG. 3 is preferably employed. In particular, a diagonal "tiling" scan format is preferably employed. This scan format is illustrated in FIGS. 4A–4C, which Figures show consecutive sections of the screen 206 being illuminated by the laser beams in a tiling pattern. The example of the diagonal tiling scan format shown in FIGS. 4A–4C includes 14 rows of laser diodes being simultaneously provided from each of laser beam sources 200 and 300 and a rotating polygon reflector 32 having N facets (or an integer multiple thereof, plus any "dead" facets between frames). Each of the N facets is tilted at a different angle, the angle for each facet corresponding to a different vertical position on the display 206 as generally indicated to the left of each vertical scan segment in FIGS. 4A–4C. The numbering of the facets for FIGS. 4A–4C is such that facet 1 corresponds to the facet tilted to illuminate the top of the display screen 206 whereas facet N is tilted to illuminate the bottom of display screen 206.

Referring first to FIG. 4A, the scan pattern begins with a first scan tile 400-1 illuminated by the laser beams from the first laser beam source, i.e., diode array 200, striking facet 1 of the rotating polygon reflector 32 and being scanned across the width of a horizontal scan segment 208. In this way, for the example of a 14 row diode array 100, 14 rows of video information are scanned in parallel across the horizontal scan segment in the first tile 400-1. The number of pixels of resolution in the horizontal direction depends on the video data and the particular application; for example, 320 pixels is a specific example for a high resolution display, but fewer or greater pixels may be provided.

Referring to FIG. 4B, the scan pattern is illustrated after the rotating polygon reflector 32 has rotated facet 1 into the optical path of the second laser beam source, i.e., diode array 300, and the second facet is in the optical path of the first laser beam source. Rotation of the reflector at this time scans the laser beams from the first and second laser beam sources over the two diagonally configured tiles 400-2 illustrated in FIG. 4B. This diagonal tiling scan pattern continues with the next consecutive tilted facet (facet 3) entering the optical path of the laser beam sources to illuminate diagonal tiles 400-3 as illustrated in FIG. 4C. This pattern continues until the entire display screen 206 has been illuminated by the laser beams. As used herein, the term "parallel scan segments" will refer to the tiles which are scanned out together in parallel, e.g., the tiles 400-2 in FIG. 4B and the tiles 400-3 illustrated in FIG. 4C.

It will be appreciated that if additional laser beam sources are provided the tiling pattern illustrated in FIGS. 4A–4C will add additional horizontal scan segments. The diagonal tiling pattern in turn will extend across the entire width of the display with the number of tiles simultaneously illuminated equal to the number of horizontal scan segments. Thus, for example, if three diode arrays were employed the scan pattern corresponding to FIGS. 4B and 4C would include three diagonally spaced tiles illuminated simultaneously. Similarly, more tiles will be simultaneously illuminated for greater numbers of laser beam sources, which as noted above may be 2–10 in number or even greater if desired for the particular application.

It will be appreciated by those skilled in the art that the ability to provide multiple tiles each multiple beams deep on display screen 208 has significant advantages in display applications. The above example using a 14 ×3 rectangular diode array provides a reasonable compromise between scanning speed and size of the diode arrays 200, 300 and a 504 line color image could thus be provided onto the display screen 206 by 36 scans of the laser beams in the horizontal direction across the display screen 206. Thus, 36 independently tilted facets could provide scanning of all 504 lines of the display 206 in a single rotation of rotating polygon 32. Therefore, the combination of the two-dimensional diode arrays 200, 300 and a multifaceted tilted facet polygon 32 allows the size and rotational velocity of the rotating polygon 32 to be reduced without compromising resolution or display size. It will be appreciated by those skilled in the art that a variety of different combinations of diode array dimensions and/or rotating polygon 32 configurations may be provided depending upon the specific requirements of any given application including cost, space available for the laser beam scanning apparatus, screen size desired, total number of scan lines required, etc. Furthermore, while a rectangular array of diodes has the advantage of ease of layout and adapts well to a rectilinear scanning of lines in a typical display application, it will be appreciated that other diode array configurations can also be employed.

The display of the present invention has a further advantage for color display applications over conventional color displays. Conventional displays, e.g., cathode ray tube (CRT) displays, cannot provide different colors precisely at a single pixel region since the phosphorous employed must have different characteristics for the different colors and must be separated. Therefore, the individual colored pixels in CRT displays are arranged side by side in a manner which optically is perceived as a single pixel by the eye. For very high resolutions, however, the limitation of having to provide three separate pixel regions for each pixel of the display can negatively impact on the resolution of the display. The present invention, however, can place the three distinct color laser beams on precisely the same pixel spot, whether for a reflective or transmissive type display screen 208, thereby avoiding a side by side placement of the color pixel regions.

Referring to FIG. 5, a block schematic drawing of the control electronics 220 is illustrated. The control electronics receives a video input signal from the video source along line 222. As noted above, the input signal may be of any of a number of conventional formats, e.g., NTSC interlaced or progressive scan formats, and may be either analog or digital in nature. The signal is provided to video interface 286 which, in the case of an analog input video signal provided along line 222, will provide analog to digital conversion of the input signal. Video interface 286 outputs the digital video data in serial format along line 288 to serial to parallel converter 290. Serial to parallel converter 290 operates in conjunction with video RAM controller 292 to convert the serial video data, which may typically be in a raster scan format, to a parallel scan format corresponding to the parallel tiling scan pattern illustrated in FIGS. 4A–4C. Video RAM controller 292 will include a high speed temporary memory such as a random access memory (RAM) or FIFO buffer of sufficient capacity to hold at least one parallel scan segment of video data, e.g., corresponding to two scan tiles. The video sync signals in the video data provided along line 288 in turn are passed through beam timing logic 294 which synchronizes the parallel scan segments with the start of frame and start of line signals typically provided in an analog or digital video signal and provides the parallel scan timing signals to the video RAM controller 292. The output of video RAM controller 292 in turn is provided independently to the red, green and blue video driver circuitry 278, 282 and 280, respectively, in the form of digital color intensity signals to allow a gray scale color control for a desired palette of colors for the color display. The video driver circuitry in turn converts the digital color intensity signals to analog drive signals provided to the individual diodes in the diode array 200 (or 300, not shown in FIG. 5) to turn them on and off with an intensity related to the gray scale drive signal and provide the desired color for each pixel.

Figure 6:
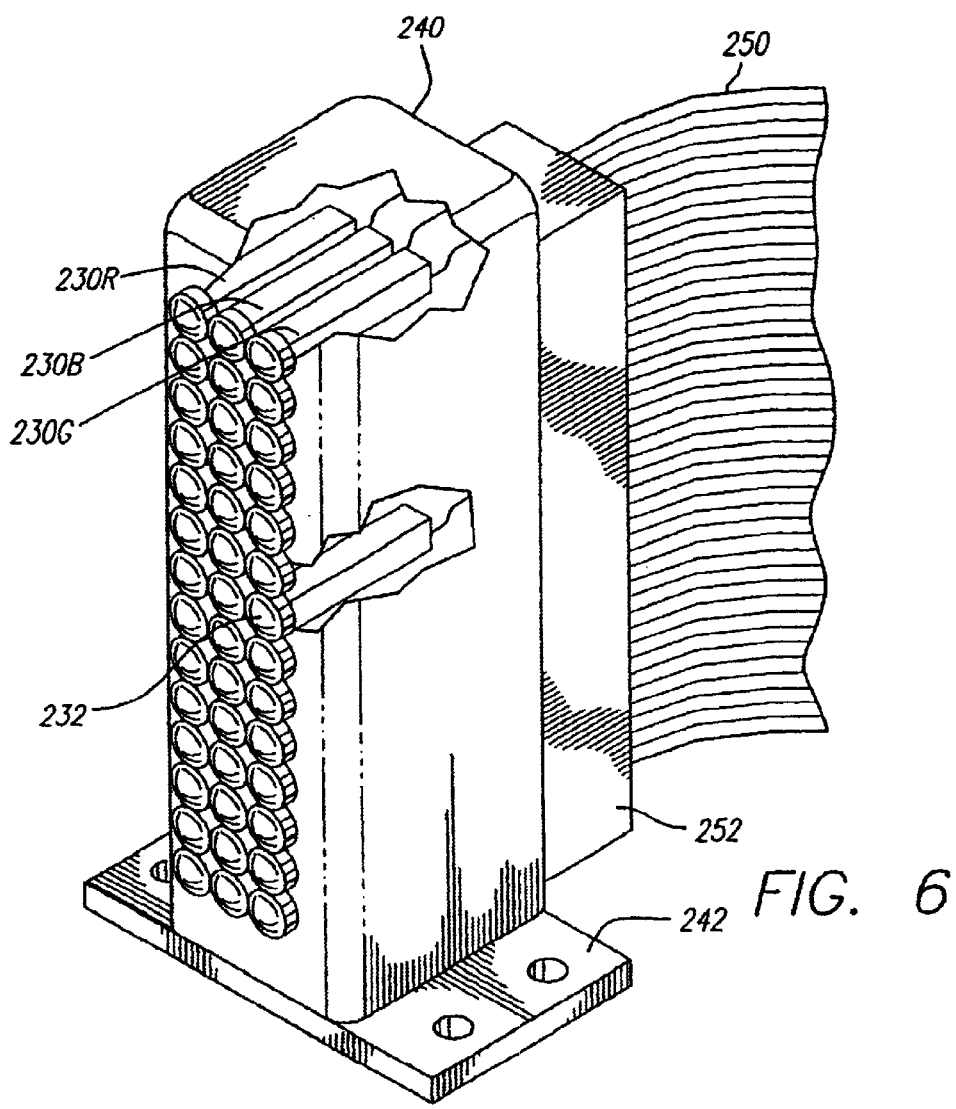
FIG. 6 is a partial cutaway view of a laser diode array in accordance with the present invention.

Referring to FIG. 6, one embodiment of the diode array 200 is illustrated in a perspective cutaway view (diode array 300 will be of identical structure and hence is not shown). As shown, the diode array 200 is provided by a compact configuration of individual laser diodes 230, e.g., color specific diodes, 230R, 230B and 230G. The individual laser diodes 230 are configured in a compact housing 240 which in turn may be mounted to a printed circuit board or other suitable support structure via mounting bracket 242. Alternatively, adhesive or other suitable mounting techniques well known to those skilled in the art may be employed. As further illustrated in FIG. 6, the individual laser diodes may preferably include a focusing lens cap 232 affixed to the output portion of the laser diode to provide an initial focusing of the laser beam. The power and control signals in turn are provided to the individual laser diodes through a suitable electrical connection, such as flex circuit 250 illustrated in FIG. 6. Flex circuit 250 is electrically and mechanically coupled to the housing 240 and individual diodes 230 via a plug connector 252. It will be appreciated that a variety of other electrical connection approaches may also be employed, however, including individual electrical connections to each laser diode 230 or provision of independent printed circuit boards for each column of the diode array. The flex circuit 250 is coupled to control electronics 220 which in turn is preferably configured on a printed circuit board. The control electronics may, however, be provided on the same circuit board which receives mounting bracket 242 or to which the housing 240 is otherwise directly mounted.

Figure 7B:
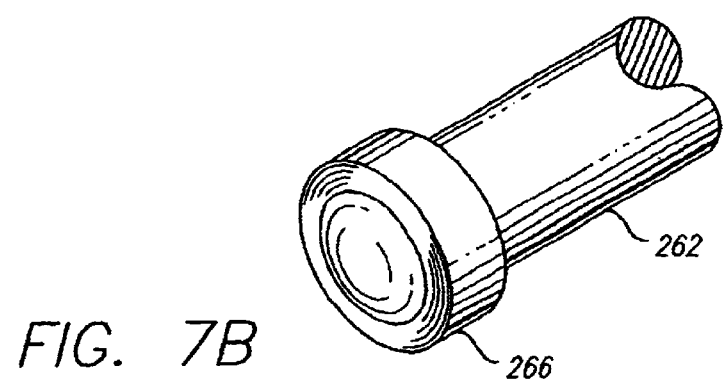
FIGS. 7A and 7B illustrate an alternate embodiment of the present invention employing a fiber optic laser beam delivery head.
Figure 7A:
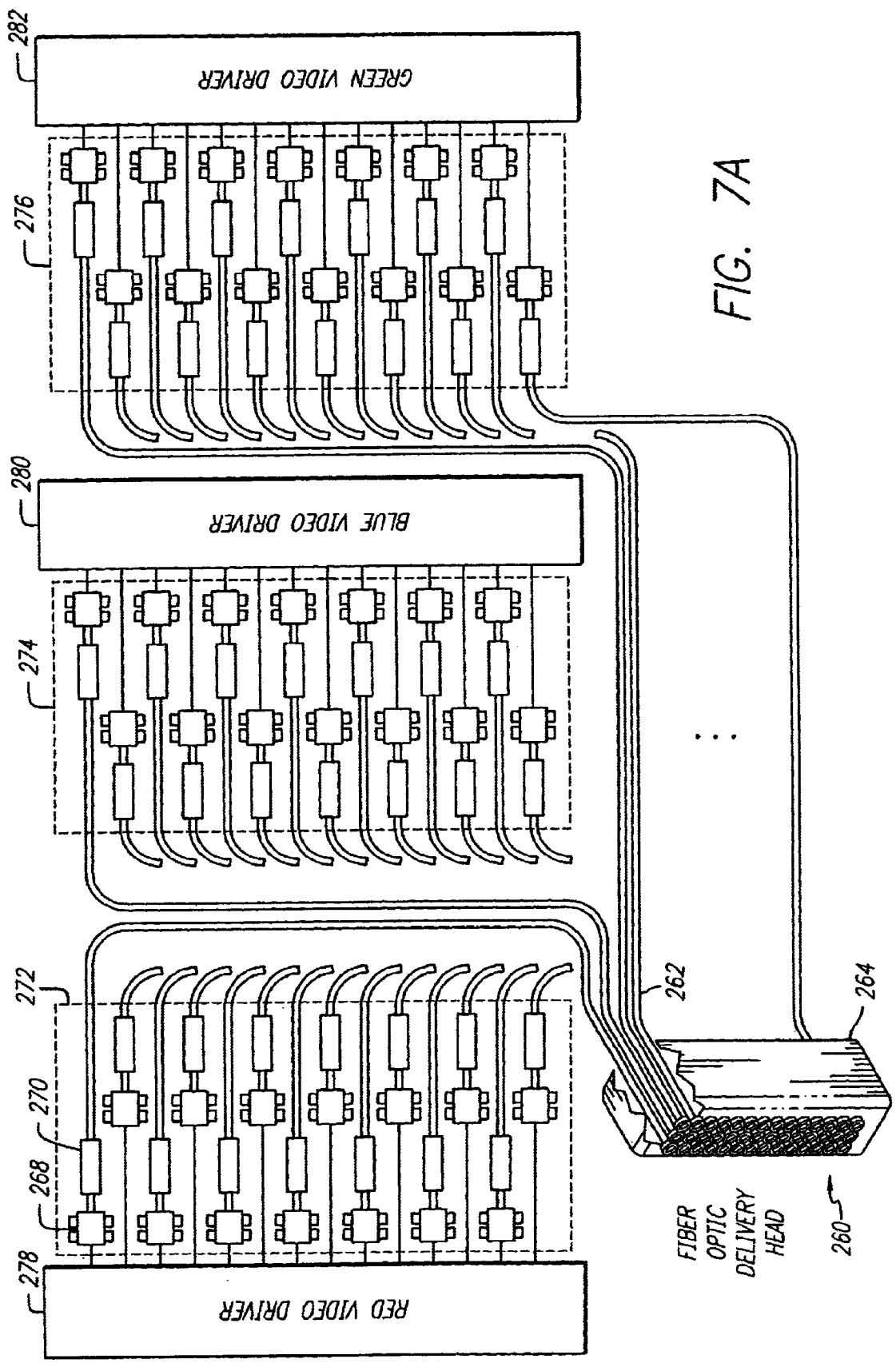

Referring to FIGS. 7A and 7B, an alternate embodiment of the laser source 200 and associated electronics is illustrated which employs a fiber optic laser beam delivery head which may be advantageous for applications having space limitations or other constraints requiring a compact laser delivery head.

As shown in FIG. 7A, the fiber optic laser beam delivery head 260 includes a bundle of optical fibers 262 arranged in a compact rectangular array within a housing 264. The ends of each of the optical fibers 262 may preferably include a focusing end cap element 266 as more clearly illustrated in FIG. 7B. Although the illustration of FIG. 7B is not intended to show the accurate optical shape of the focusing element 266, it does illustrate the compact manner in which it can be integrated with the optical fiber 262. Referring again to FIG. 7A, the opposite end of each optical fiber 262 is coupled to the output of a corresponding laser diode 268. An optional additional collimator and focuser 270 may be provided at the output of the individual laser diodes 268 depending upon the length of the optical fiber 262 and the output characteristics of the laser diodes 268. The individual laser diodes 268 and optional collimator/focusing elements 270 for each column of the diode array may be mounted on separate circuit boards 272, 274, 276 as illustrated in FIG. 7A or a single circuit board, space permitting. The length of the optical fibers 262 is chosen to enable the laser array delivery head 260 to be conveniently mounted in the desired optical path relative to the display screen 206. The individual laser diodes 268 in turn are powered by respective red, blue, and green video driver circuitry 278, 280, 282 which form part of control electronics 220 as described above. The video driver circuitry may be configured on the same circuit boards 272, 274, 276 as the laser diodes or on a separate circuit board depending on the specific application and space requirements.

Referring to FIG. 8, a compact circuit board implementation of the laser diodes driving plural fiber optic delivery heads is illustrated. As shown, two fiber optic delivery heads 330, 332 are coupled to a plurality of laser diodes 334 via optical fibers 336. The individual laser diodes 334 may be configured on a single circuit board 338 as illustrated or may be split into separate boards depending on the space requirements of the specific application. Also, as in relation to the embodiment described above in relation to FIG. 7A, optical collimator/focusing elements 340 may be provided between the output of the laser diodes and the optical fibers. As also more clearly shown in FIG. 8, the control electronics splits the video driver signals for each color (red being illustrated in FIG. 8) into parallel drive signals corresponding to the two fiber optic delivery heads.

While the foregoing detailed description of the present invention has been made in conjunction with specific embodiments, and specific modes of operation, it will be appreciated that such embodiments and modes of operation are purely for illustrative purposes and a wide number of different implementations of the present invention may also be made. Accordingly, the foregoing detailed description should not be viewed as limiting, but merely illustrative in nature.

What is claimed is:

1. A light beam display apparatus, comprising:
    a display screen having a vertical and a horizontal dimension;
    a first plurality of light beam sources configured in an array comprising a plurality of rows and at least one column;
    a second plurality of light beam sources configured in an array comprising a plurality of rows and at least one column;
    a control circuit for simultaneously and independently activating said first and second plural light beam sources; and
    an optical path including a movable reflector having a plurality of reflective facets between the display screen and the first and second light beam sources for directing said simultaneously and independently activated plural light beams to the display screen via respective first and second facets of the movable reflector to simultaneously and independently illuminate different horizontal regions of the display each comprising plural horizontal pixels.

2. A light beam scanning apparatus as set in claim 1, wherein the movable reflector is a rotatable polygon and wherein the light beam scanning apparatus further comprises a motor for rotating the polygon at a predetermined angular speed thereby bringing successive facets into the optical path so as to intercept the plural light beams.

3. A light beam scanning apparatus as set in claim 1, wherein the light beam sources in each column of the array correspond to a different color of light.

4. A light beam scanning apparatus as set out in claim 3, wherein the array has three columns and wherein each column corresponds to a light beam source having a primary color.

5. A light beam scanning apparatus as set out in claim 1, wherein the plurality of light beam sources comprise semiconductor lasers.

6. A light beam scanning apparatus as set out in claim 5, wherein the light beam sources comprise semiconductor diodes.

7. A light beam scanning apparatus as set out in claim 1, further comprising means for shifting the light beams so as to illuminate different vertical scan segments of the display screen.

8. A light beam scanning apparatus as set out in claim 7, wherein the means for shifting comprises a plurality of reflective facets configured on the movable reflector tilted at differing degrees.

9. A light beam scanning apparatus as set out in claim 8, wherein movable reflector is a rotating polygon and wherein the tilted facets are tilted relative to the axis of rotation of the polygon so as to direct the light beams to varying vertical scan segments on the display screen.

10. A light beam scanning apparatus comprising:
    an input for receiving video data, the video data including a plurality of horizontal lines of display information;
    a display screen;
    a first plurality of light beam sources configured in an array comprising a plurality of rows and at least one column;

a second plurality of light beam sources configured in an array comprising a plurality of rows and at least one column;

a movable reflector having a plurality of reflective facets;

a memory for storing a plurality of horizontal lines of video data;

a control circuit for simultaneously and independently activating said light beam sources in accordance with video data from plural horizontal lines stored in said memory; and an optical path between the display screen, the movable reflector and the first and second plurality of light beam sources for directing said simultaneously and independently activated plural beams to at least two facets of the movable reflector and to the display screen, wherein the movable reflecting scans each of the first and second plurality of light beams over only a portion of a horizontal line each portion comprising plural horizontal pixels.

11. A light beam scanning apparatus as set in claim 10, wherein the movable reflector is a rotatable polygon and wherein the light beam scanning apparatus further comprises a motor for rotating the polygon at a predetermined angular speed thereby bringing respective facets into the optical path so as to intercept the plural light beams.

12. A light beam scanning apparatus as set in claim 10, wherein each of the arrays of light beam sources have plural columns which correspond to a different color of light.

13. A light beam scanning apparatus as set out in claim 12, wherein each array has three columns and wherein each column corresponds to a light beam source of a primary color.

14. A light beam scanning apparatus as set out in claim 10, wherein the plurality of light beam sources comprise semiconductor lasers.

15. A light beam scanning apparatus as set out in claim 10, wherein each array comprises an array of fiber optic fibers mounted in an array and coupled optically to respective light emitting diodes.

16. A method of displaying information on a display screen employing a plurality of light beam sources and a movable reflector having a plurality of reflective facets, comprising:

directing a first plurality of light beams to a first facet of the movable reflector, and from the first facet to the display screen;

directing a second plurality of light beams to a second facet of the movable reflector, and from the second facet to the display screen;

moving the reflector so as to cause the first and second plurality of light beams to simultaneously and independently trace out in a first direction parallel multi-line scan segments on the display screen each scan segment comprising plural pixels in said first direction.

17. A method as set out in claim 16, wherein said display screen has a generally rectangular configuration and wherein said first direction corresponds to the horizontal dimension of said screen and said second direction corresponds to the vertical dimension of said screen.

18. A method as set out in claim 17, wherein the entire display is illuminated by sequentially illuminating parallel scan segments employing different sets of tilted facets in the optical path of the light beams.

19. A method as set out in claim 18, wherein the parallel scan segments each have a plurality of different horizontal scan lines of video information.

20. A method as set out in claim 17, wherein the parallel scan segments comprise diagonally adjacent rectangular segments of the display screen.

* * * * *